(12) United States Patent
Komatsu

(10) Patent No.: US 6,218,274 B1
(45) Date of Patent: Apr. 17, 2001

(54) SEMICONDUCTOR DEVICE AND MANUFACTURING METHOD THEREOF

(75) Inventor: Hiroshi Komatsu, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/178,892

(22) Filed: Oct. 27, 1998

(30) Foreign Application Priority Data

Oct. 28, 1997 (JP) .................................................. 9-295059

(51) Int. Cl.[7] .................................................. H01L 21/3205
(52) U.S. Cl. .......................................... 438/592; 438/595
(58) Field of Search .................................... 438/585–595, 438/301, 303, 305; 257/413

(56) References Cited

U.S. PATENT DOCUMENTS

| | | | |
|---|---|---|---|
| 5,554,566 | * | 9/1996 | Lur et al. . |
| 5,739,066 | * | 4/1998 | Pan ........................................ 438/595 |
| 5,789,298 | * | 8/1998 | Gardner et al. ....................... 438/286 |
| 5,811,342 | * | 9/1998 | Wu ........................................ 438/303 |
| 5,849,634 | * | 12/1998 | Iwata .................................... 438/655 |
| 5,915,182 | * | 6/1999 | Wu ........................................ 438/299 |
| 5,918,125 | * | 6/1999 | Guo et al. ............................. 438/264 |
| 5,960,303 | * | 9/1999 | Hill ....................................... 438/592 |
| 5,981,364 | * | 11/1999 | Ramsbey et al. ..................... 438/592 |
| 5,989,988 | * | 11/1999 | Iinuma et al. ........................ 438/592 |

* cited by examiner

Primary Examiner—Richard Booth
(74) Attorney, Agent, or Firm—Ronald P. Kananen; Rader, Fishman & Grauer

(57) ABSTRACT

A gate oxide film is formed on a silicon substrate, and a gate electrode is formed on the gate oxide film. The gate electrode is a polysilicon film that is given $p^+$ conductivity because of doping with B. An $Si_3N_4$ film is formed on the top surface of the gate electrode and sidewall spacers of $Si_3N_4$ are formed on the side walls of the gate electrode. An interlayer insulating film of $SiO_2$ is formed on the $Si_3N_4$ film, the sidewall spacers, and a LOCOS oxide film. This structure inhibits diffusion of B from the gate electrode to the interlayer insulating film in a heating process that is executed after the formation of the gate electrode.

13 Claims, 12 Drawing Sheets

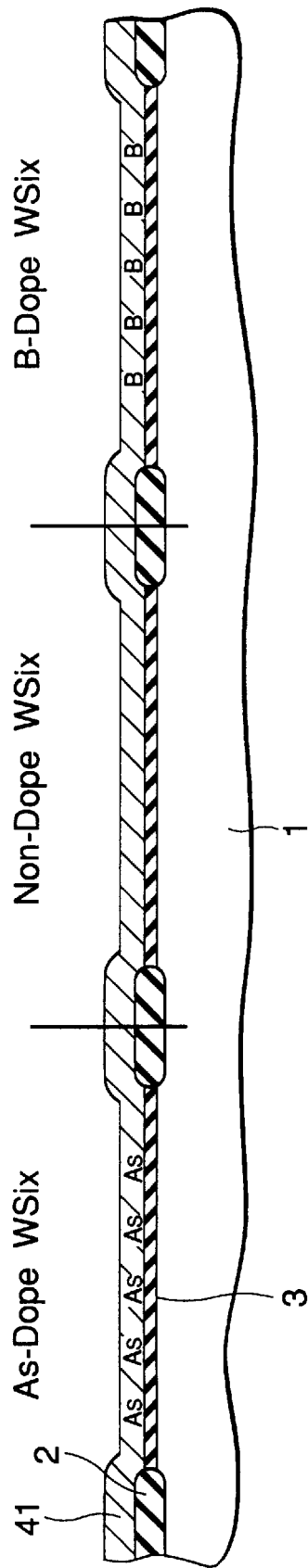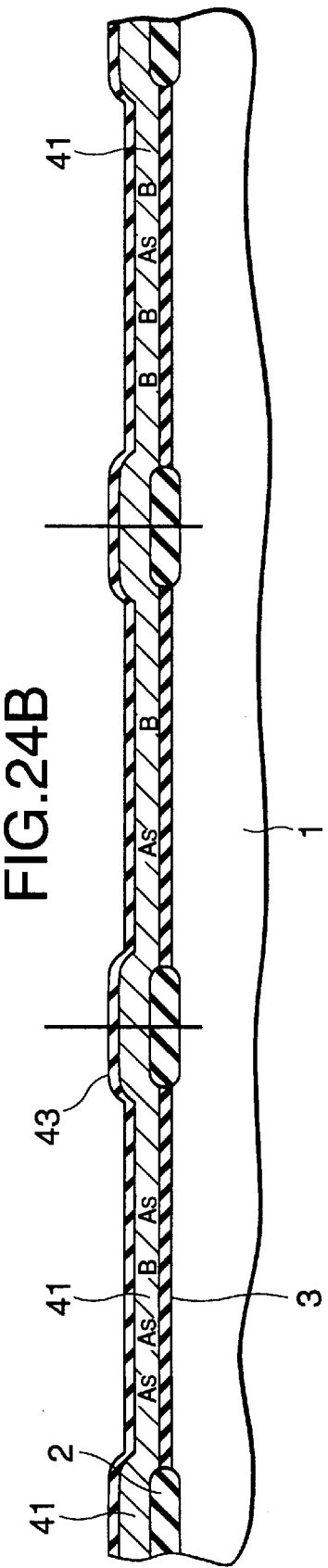

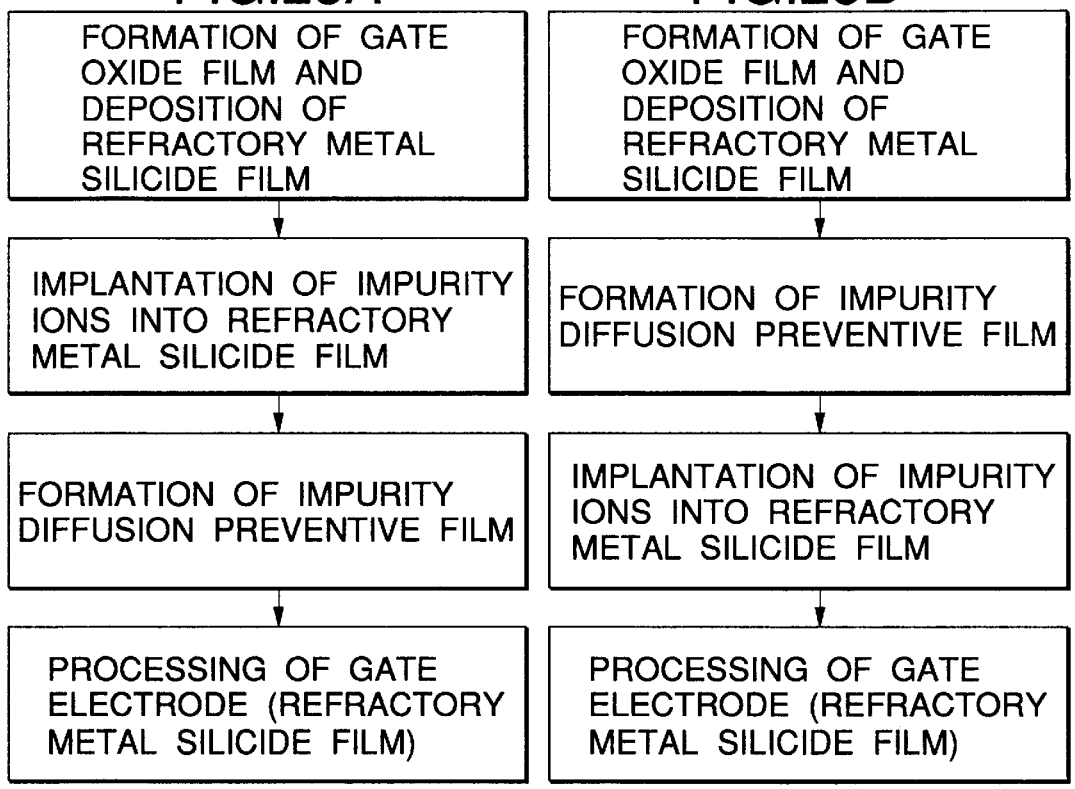

SEMICONDUCTOR DEVICE AND MANUFACTURING METHOD THEREOF

BACKGROUND OF THE INVENTION

The present invention relates to a semiconductor device and a manufacturing method thereof. In particular, the invention relates to a semiconductor device having a gate electrode doped with B (boron) which can keep its characteristics stable even if in its manufacture a heating process is executed after formation of the gate electrode, and to a manufacturing method of such a semiconductor device. The invention also relates to a method of manufacturing a semiconductor device having a refractory metal gate electrode whose work function is controlled by the kind and the concentration of an impurity introduced.

It is known that the use of an SOI (silicon on insulator) structure facilitates complete insulation between devices and makes it possible to prevent a soft error and a latch-up phenomenon that is specific to CMOS transistors. On the other hand, studies to improve the operation speed and the reliability of CMOS transistor LSIs by using an SOI structure in which the thickness of a silicon active layer is about 500 nm have been made from the early stage of its development.

In recent years, it has become apparent that if conditions for depleting the almost entire silicon active layer (complete depletion type) are established by further thinning the silicon layer as the surface layer of an SOI structure to about 100 nm and controlling the impurity concentration of the channel to relatively low, even a superior performance can be obtained such as prevention of the short channel effect and improvement of the current driving ability of a MOS transistor.

However, where $n^+$ polysilicon that has been widely used conventionally is used as a gate electrode material of an NMOS transistor, the impurity concentration of the channel should be made about $10^{17}$ cm$^{-3}$ or more to set its threshold voltage Vth at about 0.5–1.0 V that is a threshold voltage value range of ordinary enhancement-type transistors. For this reason, to realize enhancement-type transistors while keeping them of a complete depletion type, studies of using $p^+$ polysilicon (B-DOPOS (doped polysilicon)) as a gate material have been made in recent years.

On the other hand, in the field of bulk silicon devices that are now being miniaturized, because the use of only n-type polysilicon cannot make both n-channel and p-channel MOS transistors, a surface channel type transistor in which the short channel effect is less prone to occur, studies of a dual-gate process in which $n^+$ polysilicon and $p^+$ polysilicon are used for NMOS and PMOS transistors, respectively, have started with an intention of utilizing also the work function of the gate electrode to adjust the threshold voltage Vth.

FIG. 1A is a sectional view of a conventional semiconductor device, and FIG. 1B is an enlarged sectional view of a gate electrode and its vicinity (region A) of the semiconductor device of FIG. 1A. FIGS. 1A and 1B illustrate a problem that is caused by a manufacturing procedure when a heat treatment is performed after a $p^+$ polysilicon gate electrode has been formed.

As shown in FIG. 1A, a LOCOS (local oxidation of silicon) oxide film 103 is formed for device isolation on the surface of a silicon substrate 101. Then, a gate electrode 105 of B-doped $p^+$ polysilicon is formed on the silicon substrate 101 via a gate oxide film 102. Then, an interlayer insulating film 107 of SiO$_2$ is formed on the gate electrode 105 and the silicon substrate 101.

Where B-doped $p^{n+}$ polysilicon is used as the gate electrode 105, in a certain kind of heating process that is executed after the gate electrode 105 has been doped with B, B is introduced from the gate electrode 105 to the interlayer insulating film 107 (made of SiO$_2$) precipitates therein (indicated by numeral 111 in FIG. 1B). Further, B diffuses into the interlayer insulating film 107 at relatively high speed (indicated by numeral 113 in FIG. 1B) As a result, the concentration of B in the $p^+$ polysilicon gate electrode 105 decreases, whereby it may be depleted and in turn its work function may vary. It is a common understanding that the diffusion coefficient of B in the interlayer insulating film 107 is larger than that in the gate oxide film 102 even though both of them are made of SiO$_2$, because the density of the interlayer insulating film 107 is lower than that of the gate oxide film 102.

Since the degree of diffusion 113 of B into the interlayer insulating film 107 varies with the temperature of the heating process, the variation in the work function of the gate electrode 105 has a dispersion. The characteristics such as Vth of a transistor having the gate electrode 105 that is made of $p^+$ polysilicon come to have large dispersions.

It has become increasingly difficult to manufacture devices while keeping their characteristics stable by decreasing the above-described dispersions of the respective characteristics and the variation in the wafer surface of the work functions of $p^+$ polysilicon gate electrodes. This is because of not only variations in the characteristics of a $p^+$ polysilicon gate electrode as produced due to variations in a heating process that is executed after introducing an impurity into the gate electrode and a variation in the work function of $p^+$ polysilicon due to a difference of the heating process employed in manufacture that is caused by a difference in the type of semiconductor device, but also an increased effective temperature variation in the wafer surface (particularly in recent years) due to employment of RTA (rapid thermal annealing) which tends to cause a large temperature variation, an increase in wafer diameter, and other factors.

As the work function of $p^+$ polysilicon varies, Vth of transistors using it as a gate electrode varies in the wafer surface, which is a problem that will become more serious in manufacturing lower-voltage, lower-power-consumption semiconductor devices in the future. That is, if $p^+$ polysilicon (B-DOPOS) is used as a gate material, Vth becomes about 1 V that is somewhat higher than a desired value in the case of a non-doped channel, which will be a problem in future devices in which the power supply voltage will be decreased to reduce the power consumption.

The above problems are not found only in the case of a gate electrode that is a single layer of $p^+$ polysilicon that is doped with B, but found generally in the case of using a gate electrode that is doped with B that is an impurity having a large diffusion coefficient in SiO$_2$. For example, those problems also occur in a W-polycide gate that is doped with B and WSi$_x$ single-layer gate that is doped with B. That is, where a refractory metal silicide is doped with such an impurity as B, even if a predetermined amount of B is introduced B concentration in a silicide as produced varies depending on the kind of subsequent heating process, because B has large diffusion coefficients in the silicide and SiO$_2$ that is an insulating film usually surrounding a gate electrode. As a result, it is impossible to control, by only the B dose, the work function of a WSi$_x$ gate electrode as produced to a target value.

Studies have started to adjust Vth of a complete depletion type SOI transistor to a proper value by using a single layer of a refractory metal silicide such as $WSi_x$. Like $WSi_x$, many refractory metal silicides have their work functions in the vicinity of the mid-gap energy of silicon. Where a refractory metal silicide is used as the gate electrode of a complete depletion type SOI transistor, in the case of a non-doped channel, the threshold voltage Vth has a proper value that is about 0.5 V in an NMOS transistor and about −0.5 V in a PMOS It is known that where a refractory metal silicide such as $WSi_x$ or $MoSi_x$ is used as a gate electrode and its composition is made Si-rich as compared to the stoichiometric composition, its work function can be adjusted to some extent to the $p^+$ silicon side by introducing B and to the $n^+$ silicon side by introducing As as compared to the non-doped case.

As for the Vth control of transistors by a channel impurity, it has been pointed out that the Vth dispersion due to statistical fluctuation is increased as the transistors are miniaturized and the amount of an impurity contained in the channel of each transistor is decreased resultantly. Although this problem is not an urgent one unlike the case of the complete depletion type SOI transistor, a technique for solving this problem will be necessary in the future.

In the above-described circumstances, in the case of manufacturing a semiconductor device having a refractory metal silicide gate electrode whose work function is controlled, it is required to correctly control the threshold voltages Vth of various transistors of a semiconductor device to target values in such a manner that the threshold voltages Vth are made different from each other by changing the kind and the concentration of an impurity in ion implantation depending on the kind of transistor. That is, a proper semiconductor manufacturing method is required that does not vary the impurity concentration profile of a gate electrode after the ion implantation.

SUMMARY OF THE INVENTION

The present invention has been made in view of the above circumstances, and an object of the present invention is therefore to provide a semiconductor device in which a variation in threshold voltage is made small by suppressing a variation in work function among gate electrodes as produced that is caused by a heating process even if manufacturing steps executed after formation of the gate electrode that is doped with an impurity at a high concentration include the heating process, as well as a manufacturing method of such a semiconductor device.

Another object of the invention is to provide a manufacturing method of a semiconductor device which can correctly control the impurity concentration of a gate electrode to a target value even in a process in which a diffusion barrier layer is formed at a relatively high temperature to suppress outward diffusion of an impurity in a gate electrode.

The invention provides a semiconductor device comprising a gate electrode that is formed on a semiconductor substrate via a gate insulating film and in which an impurity is introduced at a high concentration; an insulating or conductive film containing nitrogen that is formed on a top surface and side walls of the gate electrode; and an interlayer insulating film formed on the insulating or conductive film and containing at least $SiO_2$.

The invention provides a first manufacturing method of a semiconductor device, comprising the steps of forming a gate insulating film on a semiconductor device; depositing a conductive film on the gate insulating film; introducing an impurity into the conductive film; depositing a first insulating film containing nitrogen on the conductive film; processing the conductive film and the first insulating film into a pattern in which a remaining portion of the first insulating film exists on a remaining portion of the conductive film that is a gate electrode; forming a second insulating film containing nitrogen on side walls of the remaining first insulating film and the gate electrode; and depositing an interlayer insulating film of $SiO_2$ on the second insulating film.

In the above semiconductor device and manufacturing method, the insulating film containing nitrogen is formed on the top surface and the side walls of the gate electrode in which an impurity is introduced at a high concentration. Therefore, even if manufacturing steps that are executed after formation of the gate electrode include a heating process, the diffusion of an impurity from the gate electrode to the interlayer insulating film containing $SiO_2$ can be inhibited in such a heating process. Therefore, the impurity introduced in the gate electrode can be activated effectively, and hence a variation in work function among gate electrodes as produced due to execution of the heating process can be suppressed, to thereby decrease the dispersion of threshold voltages.

The invention provides a second manufacturing method of a semiconductor device, comprising the steps of forming a gate insulating film on a semiconductor substrate; depositing a refractory metal silicide film on the gate insulating film; forming a thin film for preventing impurity outward diffusion on the refractory metal silicide film; and introducing an impurity into the refractory metal silicide film through the thin film.

In the above manufacturing method, the thin film for preventing impurity outward diffusion is formed on the refractory metal silicide film, an impurity is introduced into the refractory metal silicide film through the thin film. This eliminates problems that otherwise occur if an impurity were introduced into the refractory metal silicide film (gate electrode) before the thin film as an impurity diffusion barrier layer for preventing impurity outward diffusion is formed. This is because outward diffusion and spatial (i.e., lateral) redistribution of impurities in the refractory metal silicide film due to execution of a heating processing in forming the thin film can be inhibited.

The invention provides a third manufacturing method of a semiconductor device, comprising the steps of forming a gate insulating film on a semiconductor substrate; depositing a refractory metal silicide film on the gate insulating film; patterning the refractory metal silicide film into a gate electrode; forming a thin film for preventing impurity outward diffusion on all or part of surfaces of the gate electrode; and introducing an impurity into the gate electrode through the thin film.

In this manufacturing method, the thin film for preventing impurity outward diffusion is formed on all or part of the surfaces of the gate electrode after the refractory metal silicide film has been patterned, and then an impurity is introduced into the gate electrode through the thin film. Therefore, the work function of the gate electrode of each single transistor is determined by the impurity concentration as introduced and there does not occur a variation in work function due to mutual lateral diffusion of impurities in the refractory metal silicide film.

BRIEF DESCRIPTION OF THE DRAWINGS

FIG. 24A is a sectional view showing a state that ion implantation operations have been performed separately on a $WSi_x$ film in the wafer surface in such a manner that the ion species and its dose are changed for transistor types having different target threshold voltages Vth;

FIG. 24B is a sectional view showing a state that an impurity diffusion prevention layer is formed on the $WSi_x$ film of FIG. 24A and in which the impurities have been redistributed by auto-doping via a vapor phase and lateral diffusion in the $WSi_x$ film;

FIGS. 25A and 25B show manufacturing processes in which an impurity is implanted before gate electrode processing (etching);

FIGS. 25C and 25D show manufacturing processes in which an impurity is implanted after gate electrode processing.

DETAILED DESCRIPTION OF THE PREFERRED EMBODIMENTS

Several embodiments of the present invention will be hereinafter described with reference to the accompanying drawings.

Figure 1A:
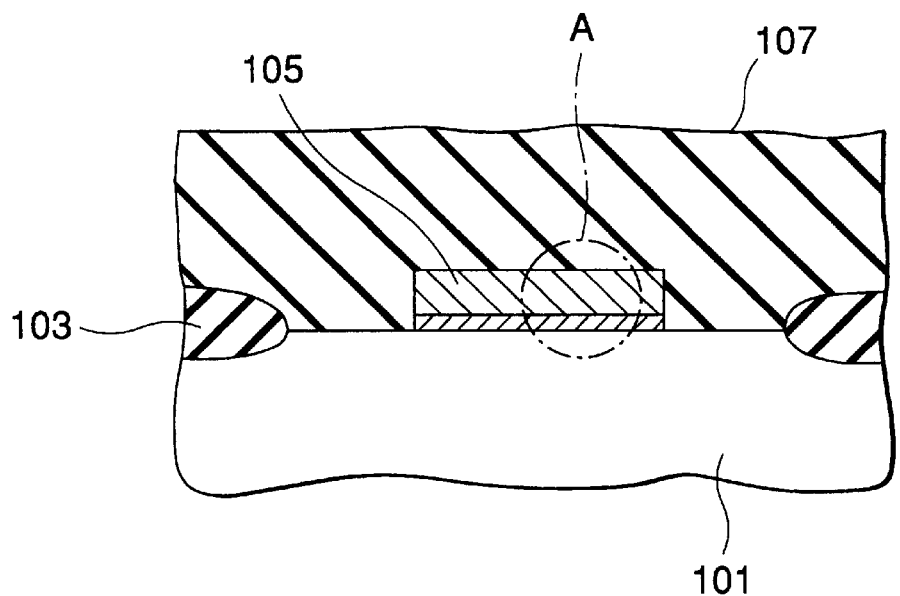
FIG. 1A is a sectional view of a conventional semiconductor device.
Figure 1B:
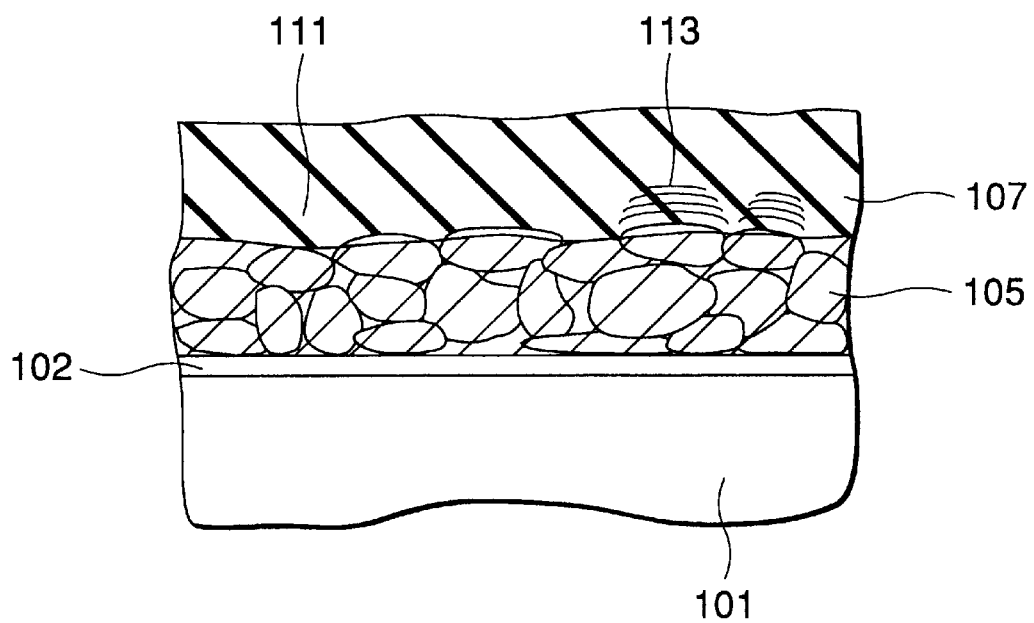
FIG. 1B is an enlarged sectional view of a gate electrode and its vicinity (region A) of the semiconductor device of FIG. 1A.
Figure 2A:
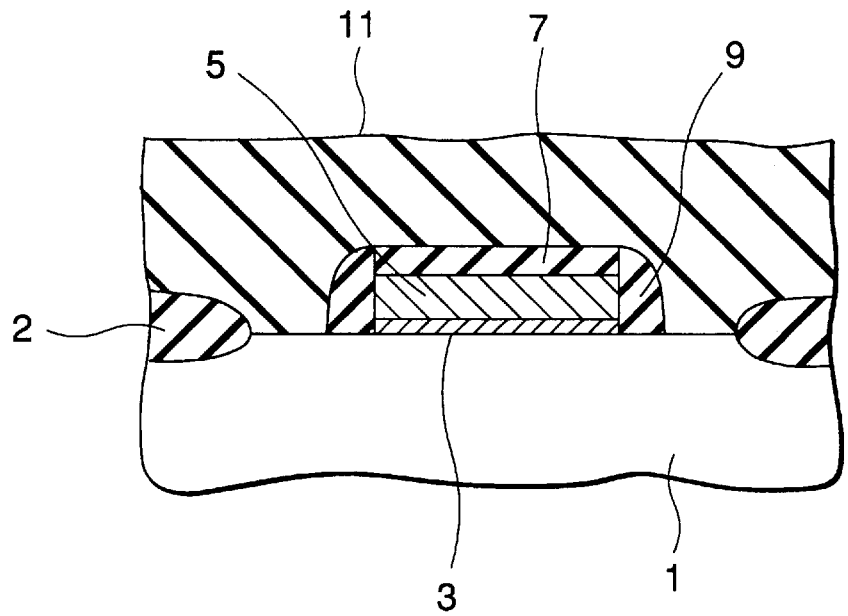
FIG. 2A is a sectional view of a semiconductor device according to a first embodiment of the invention.

FIG. 2A is a sectional view of a semiconductor device according to a first embodiment of the invention. This semiconductor device has a gate electrode that is made of $p^+$ polysilicon doped with B (boron) which is commonly used in semiconductor integrated circuits.

As shown in FIG. 2A, a LOCOS oxide film 2 is formed on the surface of a bulk silicon substrate 1. A gate oxide film 3 is formed on a surface portion of the silicon substrate 1 enclosed by the LOCOS oxide film 2, and a gate electrode 5 is formed on the gate oxide film 3. The gate electrode 5 is made of polysilicon film of, for example, 150 nm in thickness. Doped with B at a dose of about $5 \times 10^{15}$ $cm^{-2}$, the polysilicon film is of a $p^+$ type. The B concentration of the polysilicon film is about $3.3 \times 10^{20}$ $cm^{-3}$.

An $Si_3N_4$ film 7 of about 150 nm in thickness is formed on the gate electrode 5, and sidewall spacers 9 that are $Si_3N_4$ films of, for example, about 150 nm in spacer width are formed on the side walls of the gate electrode 5. The $Si_3N_4$ film 7 and the sidewall spacers 9 are formed by LPCVD (low-pressure chemical vapor deposition).

An interlayer insulating film 11 made of $SiO_2$ is formed on the $Si_3N_4$ film 7, the sidewall spacers 9, and the LOCOS oxide film 2.

In the first embodiment, the $Si_3N_4$ film 7 is formed on the top surface of the gate electrode 5 and the sidewall spacers 9 ($Si_3N_4$ films) are formed on the side walls of the gate electrode 5. Therefore, even if manufacturing steps that are executed after formation of the gate electrode 5 include a heating process, the diffusion (outward diffusion) of B from the gate electrode 5 to the interlayer insulating film ($SiO_2$) 11 can be inhibited in such a heating process. Therefore, B that is introduced in the gate electrode 5 can be activated effectively, and hence a variation in work function among gate electrodes 5 as produced due to execution of the heating process can be suppressed (which would otherwise lead to non-uniform work functions), to thereby decrease the dispersion of threshold voltages.

Further, since the gate electrode 5 is not prone to be influenced by a heating process that is executed after formation of the gate electrode 5, gate electrodes 5 made of $p^+$ polysilicon can be formed in such a manner that their work functions are kept stable. If the kinds of semiconductor devices to be manufactured are different from each other, they are subjected to different heating processes. However, even in such a case, it is possible to prevent the work functions of $p^+$ polysilicon gate electrodes as produced from varying depending on the heating process. Further, even in a case where the effective temperature variation in the wafer surface is increased because of employment of RTA which tends to cause a large temperature variation, an increase in wafer diameter, or some other factor, a variation in the wafer surface of the work functions of $p^+$ polysilicon gate electrodes as produced can be decreased and hence devices can be manufactured in such a manner that their characteristics are kept stable.

Although the first embodiment uses the gate electrode 5 that is a single layer of B-doped polysilicon, it is possible to use a polycide gate electrode having a two-layer structure of B-doped $WSi_x$ and polysilicon, or a silicide single-layer gate electrode of $WSi_x$ that is doped with B.

Although in the first embodiment the B concentration of the gate electrode 5 is set at about $3.3 \times 10^{20}$ $cm^{-3}$, the invention is not limited to such a case and the B concentration can be set at a proper value for each device.

Although the first embodiment uses the $Si_3N_4$ films 7 and 9 formed by LPCVD as films for inhibiting diffusion of B from the gate electrode 5, the films for that purpose can be insulating films such as an SiON film formed by plasma CVD or conductive films such as a TiN film formed by CVD or sputtering.

Although in the first embodiment the gate electrode 5 is doped with B at a concentration within the solid solubility, it is possible to dope the gate electrode 5 with a sufficient amount of B beyond the solid solubility. If B is introduced at a concentration beyond the solid solubility, a certain degree of temperature variation that possibly occurs in the wafer (silicon substrate) surface when a heat treatment for activating B in gate electrodes is performed on the silicon substrate can be absorbed. Therefore, the characteristics such as the work functions of the gate electrodes as produced do not vary, that is, are kept stable.

Although in the first embodiment the $Si_3N_4$ films 7 and 9 are formed on the side walls of the gate electrode 5, conductive films containing nitrogen can be formed on the top surface and the side walls of the gate electrode 5 instead of the $Si_3N_4$ films 7 and 9.

Figure 2B:
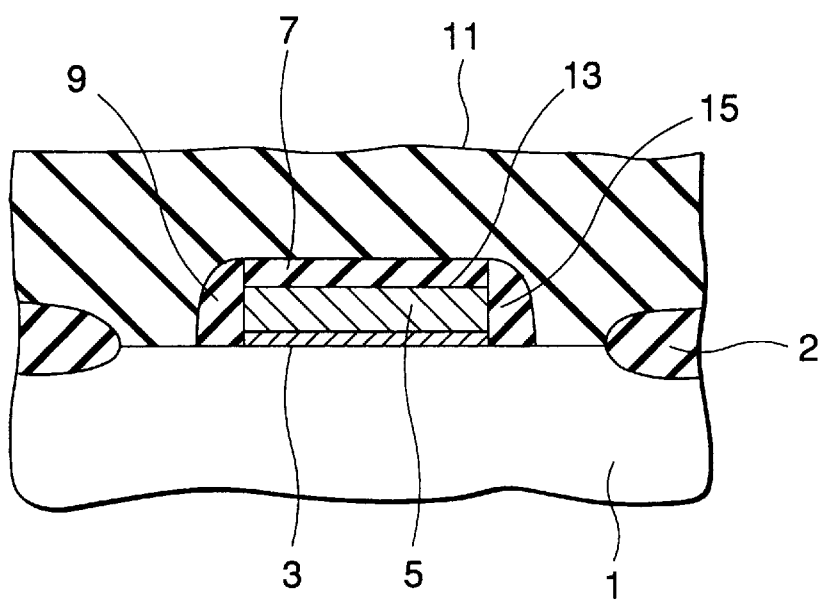
FIG. 2B is a sectional view of a semiconductor device that is a modification of the semiconductor device according to the first embodiment.

FIG. 2B is a sectional view of a semiconductor device that is a modification of the semiconductor device according to the first embodiment. The parts in FIG. 2B that are same as in FIG. 2A are given the same reference numerals as in FIG. 2A, and the following description will be directed to only the parts that are different than in FIG. 2A.

An $Si_3N_4$ film 7 of, for example, about 10 nm in thickness is formed on a gate electrode 5, and $Si_3N_4$ films 9 of, for example, about 10 nm in thickness are formed on the side walls of the gate electrode 5. An $SiO_2$ film 13 is formed on the $Si_3N_4$ film 7, and $SiO_2$ films 15 are formed on the side walls of the respective $Si_3N_4$ films 9. The $Si_3N_4$ films 7 and 9 are formed by an ordinary LPCVD method that is based on a thermal reaction of a mixed gas of $SiH_2Cl_2$ and $NH_3$. The reason why the $SiO_2$/$Si_3N_4$ two-layer films are formed on the top surface and the side walls (as offset or spacer insulating films) is to make the width of the offset or spacer insulating films a desired value.

This modification can provide basically the same advantages as the first embodiment.

Although in the above modification the $Si_3N_4$ films 7 and 9 on the top surface and the side walls of the gate electrode 5 are as thin as about 10 nm, an $Si_3N_4$ film formed by the ordinary LPCVD method that is based on a thermal reaction of a mixed gas of $SiH_2Cl_2$ and $NH_3$ exhibits sufficient barrier performance against diffusion of an impurity such as B even if it is as thin as about several nanometers.

Thinning the $Si_3N_4$ films 7 and 9 to about 10 nm inhibits increase in permittivity of the interlayer film. This allows the semiconductor device to operate at higher speed, and can minimize reduction in reliability of the device using the LP—$Si_3N_4$ films that have a high degree of stress. Where a film made of SiON or the like that is properly controlled in stress and composition by using plasma CVD or the like is used, increase in each of stress and permittivity is negligible even if a relatively thick SiON film is formed.

FIGS. 3–12 are sectional views showing a manufacturing method of a semiconductor device according to a second embodiment of the invention. This manufacturing method is to manufacture the gate electrode structure shown in FIG. 2A.

Figure 3:
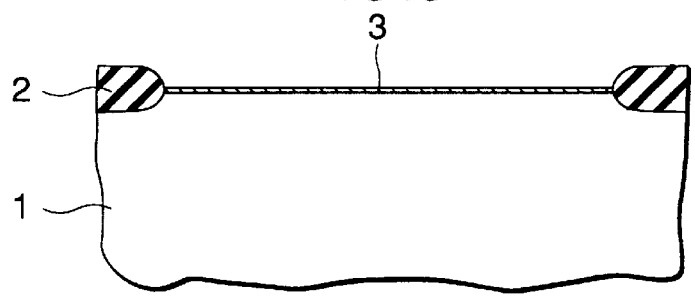
FIGS. 3–12 are sectional views showing a manufacturing method of a semiconductor device according to a second embodiment of the invention.

First, as shown in FIG. 3, a LOCOS oxide film 2 and a well (not shown) are formed in a silicon substrate 1. The LOCOS oxide film 2, the well, and other parts serve for device isolation. Then, a gate oxide film 3 is formed (grown) by thermal oxidation on a surface portion of the silicon substrate 1 in the device region.

Figure 4:
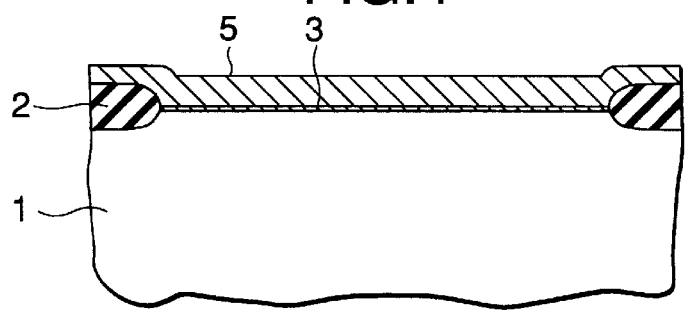

Thereafter, as shown in FIG. 4, a polysilicon film 5 (to become a gate electrode) of, for example, about 150 nm in thickness is deposited on the gate oxide film 3 and the LOCOS oxide film 2.

Figure 5:
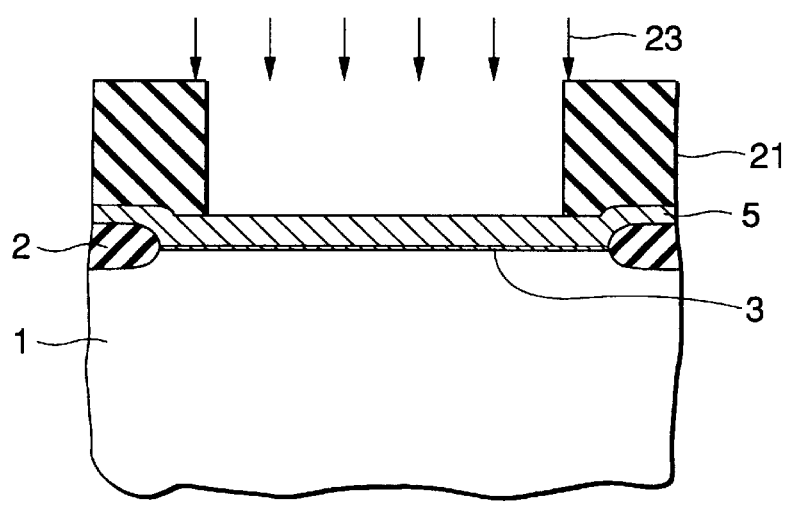

Then, as shown in FIG. 5, a photoresist film 21 is formed on the polysilicon film 5. The photoresist film 21 is so patterned as to have an opening in a PMOS region. The polysilicon film 5 is then doped with B by ion implantation (indicated by numeral 23) of, for example, $BF^{2+}$ with the photoresist film 21 used as a mask.

To make both of an NMOS transistor and a PMOS transistor a surface channel type device in which the threshold voltage is not prone to be decreased by the short channel effect, it is necessary to employ an $n^+$ gate and a $p^+$ gate in the NMOS transistor and the PMOS transistor, respectively. Therefore, the ion implantation into the gate electrodes of the NMOS transistor and the PMOS transistor are performed separately by using proper resist masks.

Figure 6:
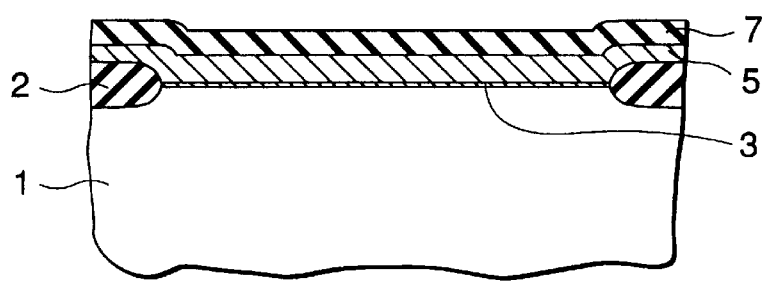

Thereafter, as shown in FIG. 6, the photoresist film 21 is removed and an $Si_3N_4$ film 7 of, for example, about 150 nm in thickness is deposited on the $p^+$ polysilicon film 5 by LPCVD. As for the deposition conditions of the $Si_3N_4$ film 7, a vertical CVD apparatus, for example, is used, the temperature and the pressure are set at 760° C. and 53 Pa, and reaction gases of $SiH_2Cl_2$, $NH_3$, and $N_2$ are introduced at respective flow rates of 90, 600, and 500 sccm.

Figure 7:
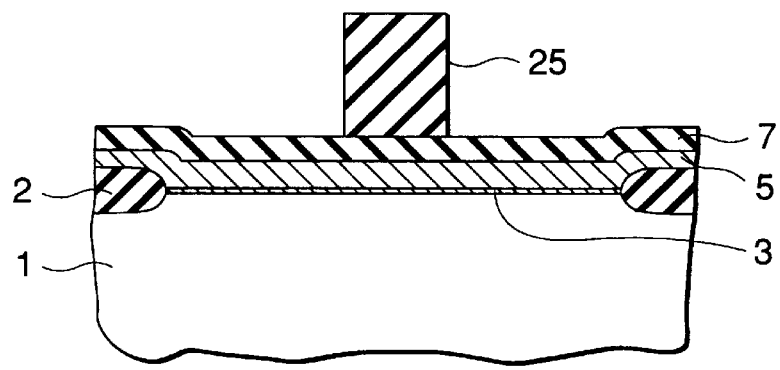

Then, as shown in FIG. 7, a photoresist film 25 having a gate electrode pattern is formed on the $Si_3N_4$ film 7.

Figure 8:
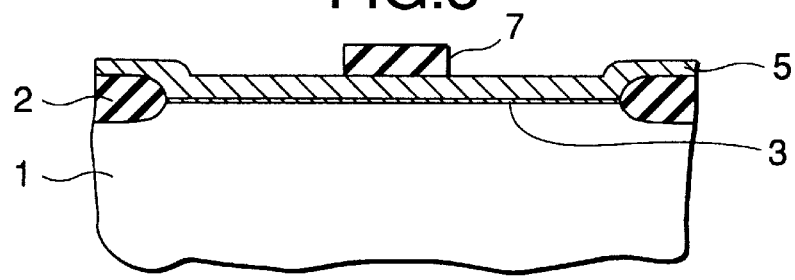

Thereafter, as shown in FIG. 8, the $Si_3N_4$ film 7 is etched with the photoresist film 25 used as a mask. As for the etching conditions of the $Si_3N_4$ film 7, a magnetron etcher, for example, is used, the temperature and the pressure are set at 20° C. and 2.7 Pa, the RF power is set at 1,000 W, and the flow rate of $CHF_3$ is set at 45 sccm. Then, the photoresist film 25 is removed.

Figure 9:
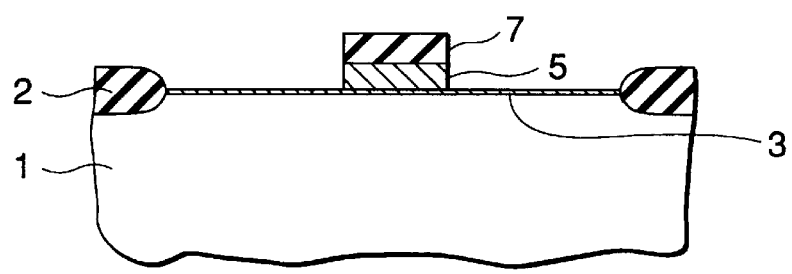

Then, as shown in FIG. 9, the $p^+$ polysilicon film 5 is etched by using a remaining $Si_3N_4$ film 7 as a mask. As a result, a gate electrode 5 that is a remaining $p^+$ polysilicon film is formed on the silicon substrate 1 via the gate oxide film 3. Subsequently, LDD (lightly doped drain) layers (not shown) are formed in the silicon substrate 1 by introducing (implanting ions of) an impurity into LDD regions (not shown) in the silicon substrate 1. It is necessary to separately perform ion implantation operations for the NMOS transistor and the PMOS transistor (i.e., for the n-type channel and the p-type channel) by using proper resist masks.

Figure 10:
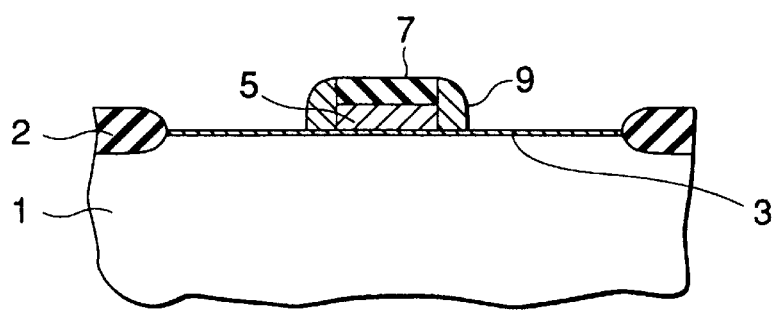

Thereafter, an $Si_3N_4$ film is deposited on the entire surface, and then etched back by anisotropic etching, whereby LDD spacers 9 ($Si_3N_4$ films) are formed on the side walls of the gate electrode 5 as shown in FIG. 10. The deposition conditions and the etching conditions of the $Si_3N_4$ film are the same as described above.

Figure 11:
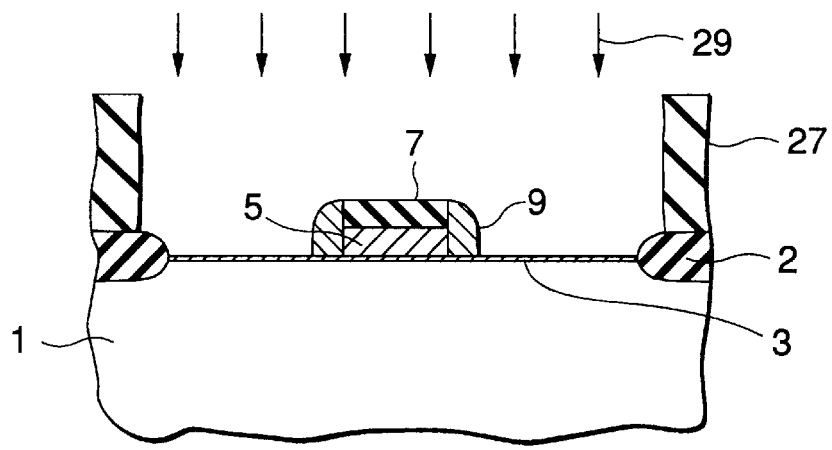

Then, after a thin oxide film (not shown) for channeling prevention is deposited, a photoresist film 27 is formed on the silicon substrate 1 as shown in FIG. 11. The photoresist film 27 is so patterned as to have an opening in a source and drain regions forming region. Subsequently, diffusion layers (not shown) of source and drain regions are formed by introducing an impurity, for example, implanting ions $BF^{2+}$ (indicated by numeral 29), into the silicon substrate 1 by using the photoresist film 27 as a mask. It is necessary to separately perform ion implantation operations for the NMOS transistor and the PMOS transistor (i.e., for the n-type channel and the p-type channel) by using proper resist masks.

Then, after the photoresist film 27 is removed, a heat treatment (annealing) is performed to activate the gate electrode 5, the LDD layers, the diffusion layers of the source and drain regions, and other impurity-introduced layers. As for the heat treatment conditions, for example, RTA is performed at 1,000° C. for 10 seconds in an Ar atmosphere.

Figure 12:
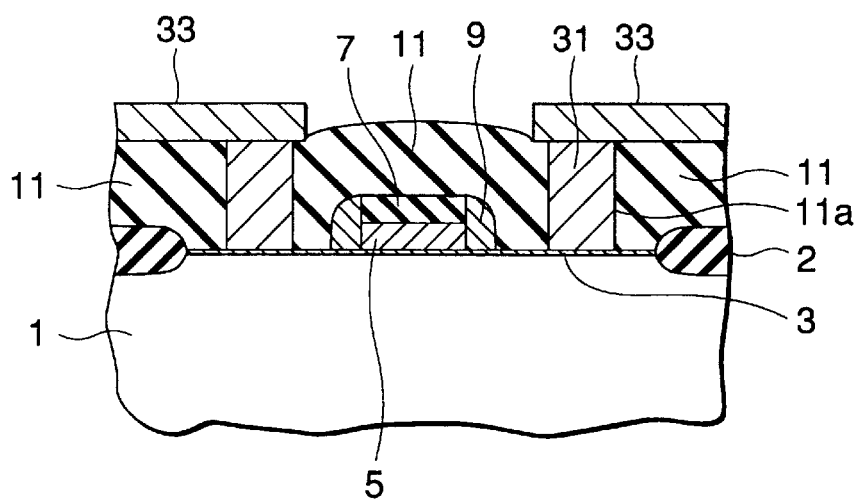

Thereafter, as shown in FIG. 12, an interlayer insulating film 11 is deposited on the $Si_3N_4$ film 7, the sidewall spacers 9, and the silicon substrate 1 by an ordinary process. Subsequently, contact holes 11a are formed through the interlayer insulating film 11 and then filled in by metal 31. Interconnections 33 are formed on the metal members 31, to complete the device.

In the second embodiment, the $Si_3N_4$ film 7 is formed on the top surface of the gate electrode 5 and the sidewall spacers 9 ($Si_3N_4$ films) are formed on the side walls of the gate electrode 5. Therefore, the diffusion (outward diffusion) of B from the gate electrode 5 to the interlayer insulating film ($SiO_2$) 11 can be inhibited in a heating process that is executed after formation of the gate electrode 5. Therefore, B that is introduced in the gate electrode 5 can be activated effectively, and hence a variation in work function among gate electrodes 5 as produced due to execution of the heating process can be suppressed, to thereby decrease the dispersion of threshold voltages.

Further, since the gate electrode 5 is not prone to be influenced by a heating process that is executed after formation of the gate electrode 5, gate electrodes 5 made of $p^+$ polysilicon can be formed in such a manner that their work functions are kept stable. If the kinds of semiconductor devices to be manufactured are different from each other, they are subjected to different heating processes. However, even in such a case, it is possible to prevent the work functions of $p^+$ polysilicon gate electrodes as produced from varying depending on the heating process. Further, even in a case where the effective temperature variation in the wafer surface is increased because of employment of RTA which tends to cause a large temperature variation, an increase in wafer diameter, or some other factor, a variation in the wafer surface of the work functions of $p^+$ polysilicon gate electrodes as produced can be decreased and hence devices can be manufactured in such a manner that their characteristics are kept stable.

That is, surrounding the gate electrode 5 by insulating films made of, for example, $Si_3N_4$ that inhibit diffusion of an impurity can prevent the concentration of B in the gate electrode 5 after a heat treatment from becoming lower than before it as a result of outward diffusion. In other words, the B concentration of the gate electrode 5 can be kept at a high value that is the same as immediately after the B doping irrespective of execution/non-execution of a heat treatment, the heat treatment temperature, and the heat treatment time. Therefore, a variation in B concentration among gate electrodes as produced can be kept small even if the heating process is changed or the effective temperature profile in the wafer surface that is caused by the heating process deteriorates.

Although the second embodiment is directed to the manufacturing method of a semiconductor device that uses the gate electrode 5 that is a single layer of B-doped polysilicon, there may be used a polycide gate electrode having a two-layer structure of $WSi_x$ and polysilicon, or a silicide single-layer gate electrode of $WSi_x$.

Although in the second embodiment the invention is applied to the transistor formed on the bulk silicon substrate 1, the invention can be applied to devices having an SOI structure.

The second embodiment is directed to the manufacturing method of a semiconductor device that uses $Si_3N_4$ film 7 and the LDD spacers 9 as insulating films for diffusion prevention. On the other hand, the semiconductor device shown in FIG. 2B can be manufactured by, for example, depositing a combination of a thin $LP-Si_3N_4$ film and an $SiO_2$ film at respective thicknesses of 10 nm and 140 nm, only with small modifications to the etching conditions of the offset insulating films or sidewall spacer films on the gate electrode 5.

Specifically, in the second embodiment, the $Si_3N_4$ film 7 of about 150 nm in thickness is deposited on the polysilicon film 5 by LPCVD as shown in FIG. 6, and the LDD spacers 9 ($Si_3N_4$ films) are formed on the side walls of the gate electrode 5 by depositing an $Si_3N_4$ film on the entire surface and etching it back by anisotropic etching. On the other hand, LDD spacers composed of an $Si_3N_4$ film and an $SiO_2$ film can be formed on the side walls of the gate electrode 5 by depositing a thin $Si_3N_4$ film of about 10 nm in thickness on the polysilicon film 5 by LPCVD, depositing an $SiO_2$ film of about 140 nm in thickness on the $Si_3N_4$ film, then forming thin $Si_3N_4$ films of about 10 nm in thickness on the side walls of the gate electrode 5 by LPCVD, and finally forming $SiO_2$ films of about 140 nm in thickness on the sidewall $Si_3N_4$ films.

As described above, an $Si_3N_4$ film having a thickness of about 10 nm or even about several nanometers formed by an ordinary LPCVD method can satisfactorily inhibit outward diffusion of an impurity such as B from the gate electrode 5.

Although in the second embodiment the gate oxide film 3 is formed on the surface of the silicon substrate 1 by thermal oxidation, it is possible to form an oxynitride film as a gate insulating film on the silicon substrate 1 by nitriding an oxide film. Since the B concentration of the gate electrode 5 is decreased mainly by the phenomenon that B that is introduced in the gate electrode 5 is diffused outward through the interlayer insulating film 11 having a large diffusion coefficient, the reduction is B concentration can be prevented by inhibiting outward diffusion at the top surface and the side walls of the gate electrode 5. However, it is preferable to further decrease the diffusion rate of B by employing, as the gate oxide film 3, an oxynitride film formed by nitriding an oxide film, to thereby further inhibit the reduction in the B concentration of the gate electrode 5 more satisfactorily and inhibit satisfactorily variations in the work functions etc. of gate electrodes 5 as produced.

FIGS. 13–23 are sectional views showing a manufacturing method of a semiconductor device according to a third embodiment of the invention. In this embodiment, the invention is applied to manufacture of a MOS semiconductor device having a work-function-controlled $WSi_x$ gate electrode formed on a bulk silicon substrate.

Figure 13:
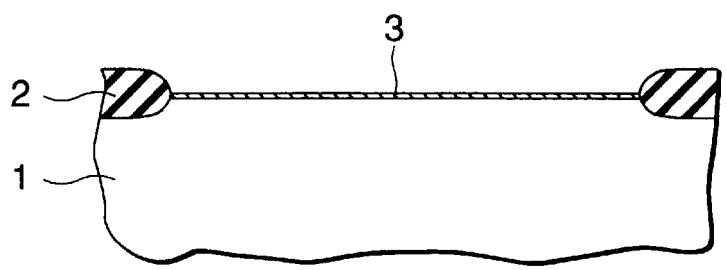
FIGS. 13–23 are sectional views showing a manufacturing method of a semiconductor device according to a third embodiment of the invention.

First, as shown in FIG. 13, a LOCOS oxide film 2 and a well (not shown) are formed in a silicon substrate 1. The LOCOS oxide film 2, the well, and other parts serve for device isolation. Then, a gate oxide film 3 is formed (grown) by thermal oxidation on a surface portion of the silicon substrate 1 in the device region.

Figure 14:
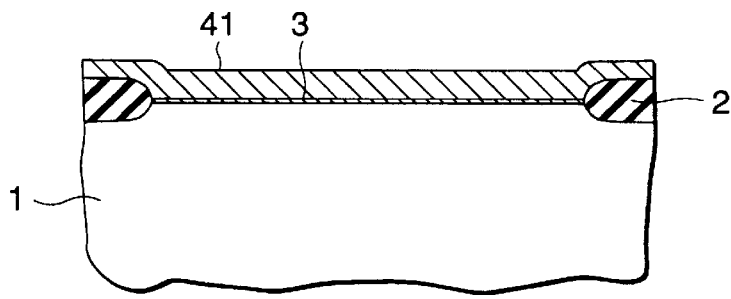

Thereafter, as shown in FIG. 14, a $WSi_x$ film 41 (to become a gate electrode) of, for example, about 100 nm in thickness is deposited on the gate oxide film 3 and the LOCOS oxide film 2. As for the deposition conditions of the $WSi_x$ film 41, a cold wall CVD apparatus, for example, is used, the temperature and the pressure are set at 680° C. and 40 Pa, and reaction gases of $SiH_2Cl_2$, $WF_6$, and Ar are introduced at respective flow rates of 100, 1.6, and 100 sccm. The composition ratio of the $WSi_x$ film 41 is set such that W:Si=1:3.0.

The reason why the $WSi_x$ film 41 is Si-rich as compared to the stoichiometric composition is to allow the work function of a gate electrode as produced to be controlled in accordance with the kind and the dose of an impurity, such as As, B, or P, that will be introduced into the $WSi_x$ film 41 in later steps.

Figure 15:
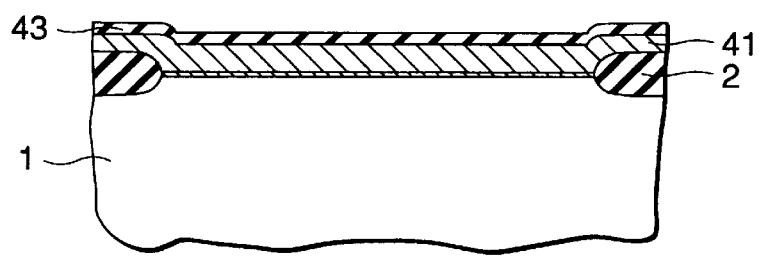

Then, as shown in FIG. 15, an $Si_3N_4$ film 43 of, for instance, about 10 nm in thickness is deposited on the $WSi_x$ film 41 by LPCVD. As for the deposition conditions of the $Si_3N_4$ film 43, a vertical CVD apparatus, for example, is used, the temperature and the pressure are set at 760° C. and 53 Pa, and reaction gases of $SiH_2Cl_2$, $NH_3$, and $N_2$ are introduced at respective flow rates of 90, 600, and 500 sccm. The $Si_3N_4$ film 43 is to inhibit outward diffusion of B from the top surface of the gate electrode.

Figure 16:
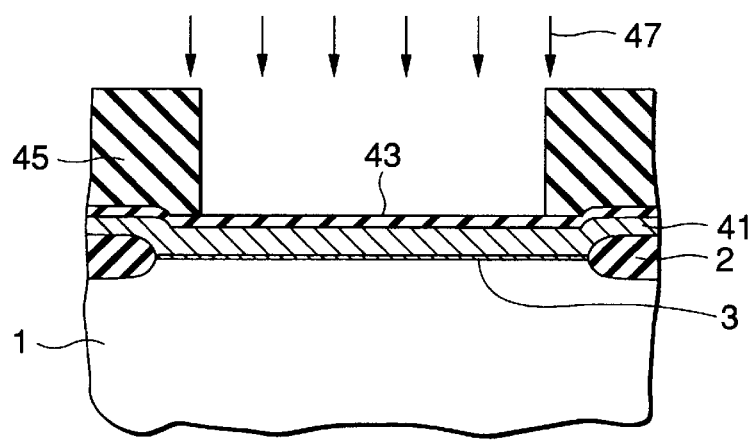

Then, as shown in FIG. 16, a photoresist film 45 is formed on the $Si_3N_4$ film 43, and the $WSi_x$ film 41 (to become a gate electrode) is doped with an impurity such as $B^+$ ions 47 by, for example, ion implantation by using the photoresist film 45 as a mask. At this time, to simultaneously form gate electrodes having different work functions (i.e., transistors having different threshold voltages Vth) on the same wafer, gate ion implantation operations are performed separately by using proper resist masks in such a manner that the ion species and its dose are changed for the transistor types having different threshold voltages Vth.

Figure 17:
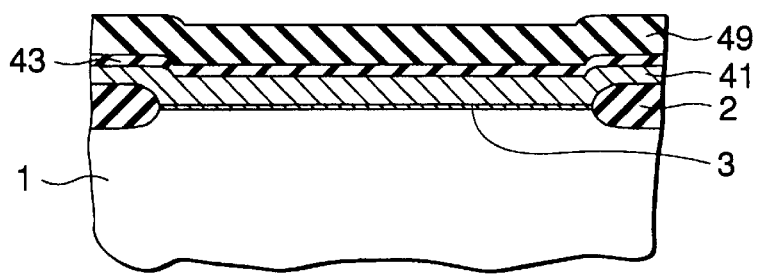

Thereafter, as shown in FIG. 17, the photoresist film 45 is removed and an $SiO_2$ film 49 of, for instance, 150 nm in thickness is deposited on the $Si_3N_4$ film 43. The $SiO_2$ film 49 is to prevent ions from entering the gate electrode in ion implantation for forming high-concentration diffusion layers.

It is desirable that the $SiO_2$ film 49 be deposited at a low temperature. For example, in the case of an $SiH_4+O_2$ reaction system, the $SiO_2$ film 49 is deposited at 350° C.–450° C. by using an atmospheric pressure CVD apparatus or the like. This is to prevent mutual lateral diffusion of the impurities that have been introduced separately into the $WSi_x$ film 41 by ion implantation by using proper resist masks in the step of FIG. 16.

Figure 18:
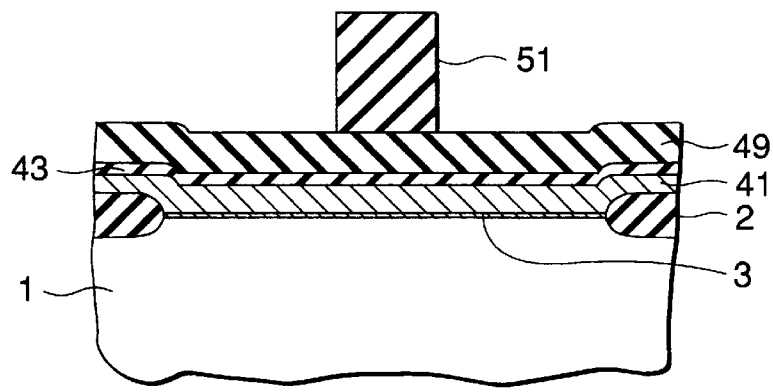

Then, as shown in FIG. 18, a photoresist film 51 having a gate electrode pattern is formed on the $SiO_2$ film 49.

Figure 19:
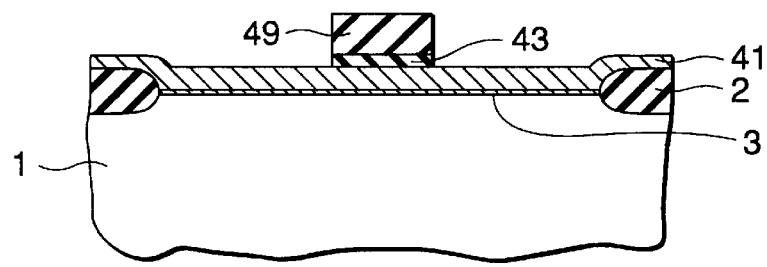

Thereafter, as shown in FIG. 19, the $SiO_2$ film 49 and the $Si_3N_4$ film 43 are etched with the photoresist film 51 used as a mask. As for the etching conditions of the $SiO_2$ film 49 and the $Si_3N_4$ film 43, a magnetron etcher, for example, is used, the temperature and the pressure are set at 20° C. and 2.7 Pa, the RF power is set at 1,000 W, and the flow rate of $CHF_3$ is set at 45 sccm. Then, the photoresist film 51 is removed.

Figure 20:
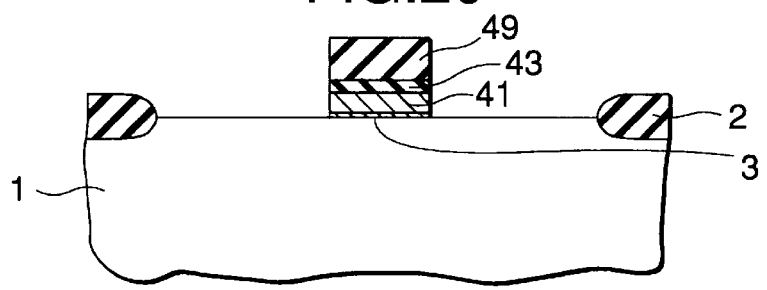

Then, as shown in FIG. 20, the $WSi_x$ film 41 is etched by using a remaining $SiO_2$ film 49 as a mask. As a result, a gate electrode 41 that is a remaining $WSi_x$ film is formed on the silicon substrate 1 via the gate oxide film 3. Subsequently, LDD layers (not shown) are formed in the silicon substrate 1 by introducing an impurity into LDD regions (not shown) in the silicon substrate 1. In this impurity introduction, ion implantation operations for the NMOS transistor and the PMOS transistor are performed separately by using proper resist masks.

Figure 21:
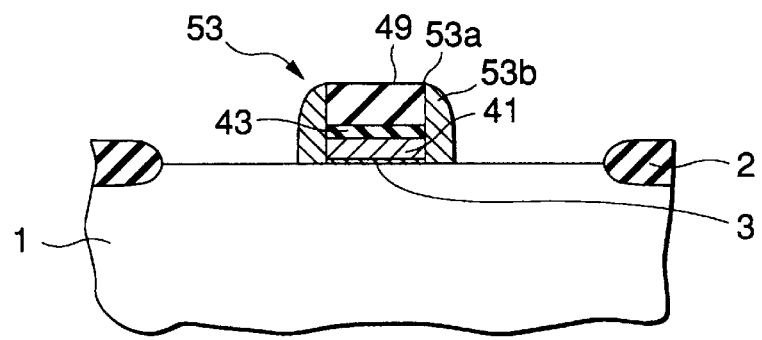

Thereafter, an $Si_3N_4$ film 53a of, for example, 10 nm in thickness is deposited on the entire surface so as to contact the side walls of the $WSi_x$ film 41, and then an $SiO_2$ film 53b of, for example, 150 nm in thickness is deposited on the $Si_3N_4$ film 53a. Then, the $Si_3N_4$ film 53a and the $SiO_2$ film 53b are etched back by anisotropic etching, whereby LDD spacers 53 ($SiO_2/Si_3N_4$) are formed on the side walls of the gate electrode 41 and the $SiO_2$ film 49 as shown in FIG. 21. The deposition conditions and the etching conditions of the $Si_3N_4$ film 53a and the $SiO_2$ film 53b are the same as described above. The reason why the LDD spacers 53 have the $SiO_2/Si_3N_4$ two-layer structure is to inhibit outward diffusion of the impurity from the side walls of the $WSi_x$ gate electrode 41 in later heat treatment steps.

Figure 22:
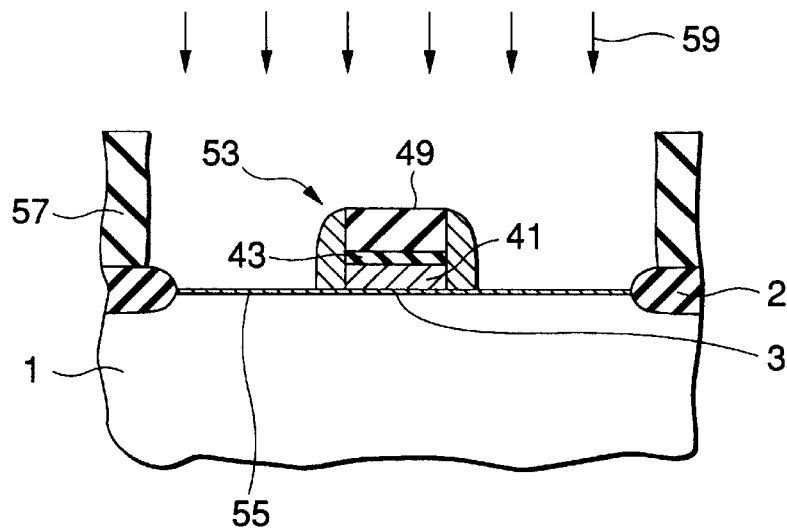

Then, after a thin oxide film 55 for channeling prevention is deposited on the silicon substrate 1, a photoresist film 57 is formed on the silicon substrate 1 as shown in FIG. 22. The photoresist film 57 is so patterned as to have an opening in a source and drain regions region forming. Subsequently, diffusion layers (not shown) of source and drain regions are formed by introducing an impurity, for example, implanting ions $BF^{2+}$ (indicated by numeral 59), into the silicon substrate 1 by using the photoresist film 57 as a mask. In this step, ion implantation operations are performed separately for the NMOS transistor and the PMOS transistor by using proper resist masks.

Then, after the photoresist film 57 is removed, a heat treatment is performed to activate the gate electrode 41, the LDD layers, the diffusion layers of the source and drain regions, and other impurity-introduced layers. As for the heat treatment conditions, for example, RTA is performed at 1,000° C. for 10 seconds in an Ar atmosphere.

Figure 23:
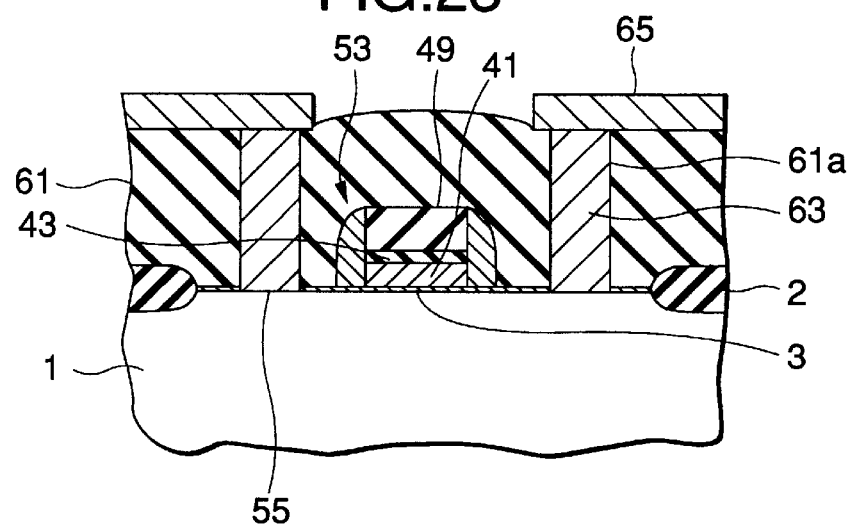

Thereafter, as shown in FIG. 23, an interlayer insulating film 61 is deposited on the $SiO_2$ film 49, the sidewall spacers 53, and the silicon substrate 1 by an ordinary process. Subsequently, contact holes 61a are formed through the interlayer insulating film 61 and then filled in by metal 63. Interconnections 65 are formed on the metal members 63, to complete the device.

In the third embodiment, the $Si_3N_4$ film 43 as a diffusion barrier layer is formed on the $WSi_x$ film 41 (to become a gate electrode) in the step of FIG. 15, and an impurity is introduced into the $WSi_x$ film 41 through the $Si_3N_4$ film 43 (diffusion barrier layer) by ion implantation or the like in the step of FIG. 16. Therefore, there does not occur a problem that is caused by introducing, before formation of an impurity diffusion barrier layer, impurities into the gate electrode forming film (silicide film) separately in the wafer surface by using proper resist masks in such a manner that the ion species and its dose are changed for transistor types having different target threshold voltages Vth as shown in FIG. 24A. That is, there no longer occurs a problem that a heating process in forming the diffusion barrier layer causes outward diffusion and spatial (i.e., lateral) redistribution of the impurities in the gate electrode forming film as shown in FIG. 24B.

That is, in a case where, as in the second embodiment, after impurities have been introduced into a gate electrode forming film an $Si_3N_4$ film serving as a barrier to diffusion of the impurities is deposited on the gate electrode forming film by LPCVD (an $Si_3N_4$ film formed by LPCVD is the best in terms of the impurity diffusion barrier performance and the film thickness controllability), or in a case where a WN film is formed on the surface of a $WSi_x$ gate electrode forming film by directly nitriding it, as high a temperature as about 800° C. is needed to form the diffusion barrier layer ($Si_3N_4$ film or WN film) and hence there arise problems of outward diffusion and spatial (i.e., lateral) redistribution of the impurities in the gate electrode forming film. This corresponds to a process shown in FIG. 25A. In contrast, in the third embodiment, since impurities are introduced into the $WSi_x$ film (gate electrode forming film) 41 after the diffusion barrier layer ($Si_3N_4$ film) 43 have been formed, the problems of outward diffusion and spatial (i.e., lateral) redistribution of the impurities in the $WSi_x$ film 41 do not arise. This corresponds to a process shown in FIG. 25B.

Therefore, refractory metal silicide gate electrodes having correct target work functions can be obtained by properly selecting ion species to be introduced into the $WSi_x$ film 41 by ion implantation and properly setting their doses.

In particular, since influence of mutual lateral diffusion of impurities in the $WSi_x$ film 41 can be eliminated, in forming gate electrodes having different work functions by introducing different ion species at different doses in the wafer surface, the work functions can be controlled correctly without causing the impurities to influence each other.

Further, it becomes possible to obtain a refractory metal silicide gate electrode having a target impurity concentration as a result of correct control irrespective of the method and the conditions (particularly the heat treatment process) for forming a thin film (diffusion barrier layer) for inhibiting outward diffusion of an impurity in a gate electrode forming film.

Although in the third embodiment the invention is applied to the manufacture of the MOS semiconductor device formed on the bulk silicon substrate 1 and having the WSi$_x$ gate electrode 41 whose work function is controlled, the invention can also be applied to manufacture of semiconductor devices having other kinds of gate electrodes. For example, the invention can be applied to manufacture of a semiconductor device having a gate electrode made of such a refractory metal silicide as MoSi$_x$. The invention is particularly effective in a case where a gate electrode is formed by using such a silicide as MoSi$_x$ whose work function greatly varies from as low a dose as about $1 \times 10^{13}$ cm$^{-2}$. Where to form transistors having different threshold voltages, ions of different impurities are implanted into a gate electrode forming film at different concentrations for respective locations before forming a diffusion prevention layer (Si$_3$N$_4$ film), outward diffusion and spatial (i.e., lateral) redistribution of the impurities in the gate electrode forming film are serious problems. That is, spatial redistribution or the like of impurity concentrations occurs via a vapor phase by, for example, auto-doping during formation of an Si$_3$N$_4$ film by LPCVD, and resultantly the work functions of the gate electrodes deviate from respective target values, whereby the threshold voltages Vth of resulting transistors deviate from respective target values. In contrast, in the third embodiment, since impurities are introduced into the gate electrode forming film 41 after formation of the diffusion prevention film (Si$_3$N$_4$ film 43), no influence is given by the heating process in forming the diffusion prevention layer.

Although in the third embodiment the invention is applied to the semiconductor device formed on the bulk silicon substrate 1, the invention can also be applied to a semiconductor device formed on an SOI substrate.

Although in the third embodiment the Si$_3$N$_4$ film 53$a$ that is in contact with the gate electrode 41 and serves to inhibit outward diffusion of the impurity in the gate electrode 41 is deposited by LPCVD, it is possible to grow a refractory metal nitride film (WN$_x$ film) by directly nitriding the gate electrode 41 itself.

All of the numerical values of the parameters such as the thicknesses of the respective thin films used in the third embodiment are just examples, and the values of those parameters can be set properly in designing in accordance with an intended semiconductor device.

FIGS. 26–33 are sectional views showing a manufacturing method of a semiconductor device according to a fourth embodiment of the invention. This embodiment is directed to a case where a thin film for preventing outward diffusion of an impurity is deposited after a refractory metal silicide film has been processed into a gate electrode and ion implantation into the gate electrode is performed through the thin film.

Figure 26:
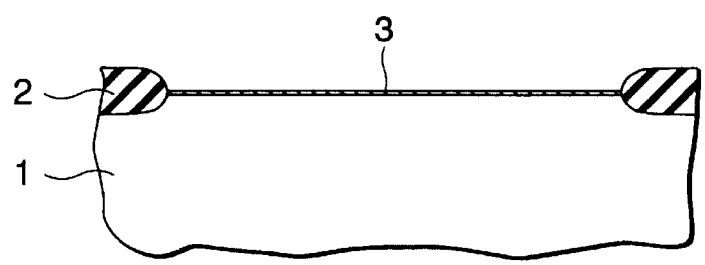
FIGS. 26–33 are sectional views showing a manufacturing method of a semiconductor device according to a fourth embodiment of the invention.

First, as shown in FIG. 26, a LOCOS oxide film 2 and a well (not shown) are formed in a silicon substrate 1. The LOCOS oxide film 2, the well, and other parts serve for device isolation. Then, a gate oxide film 3 is formed (grown) by thermal oxidation on a surface portion of the silicon substrate 1 in the device region.

Figure 27:
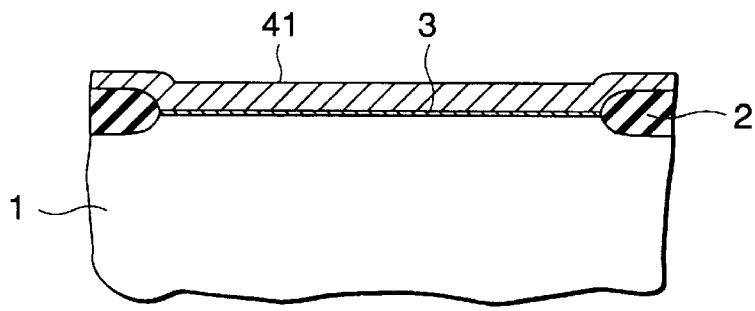

Thereafter, as shown in FIG. 27, a WSi$_x$ film 41 (to become a gate electrode) of, for example, about 100 nm in thickness is deposited on the gate oxide film 3 and the LOCOS oxide film 2. The deposition conditions of the WSi$_x$ film 41 are the same as in the third embodiment. The composition ratio of the WSi$_x$ film 41 is set such that W:Si=1:3.0.

The reason why the WSi$_x$ film 41 is Si-rich as compared to the stoichiometric composition is to allow the work function of a gate electrode as produced to be controlled in accordance with the kind and the dose of an impurity, such as As, B, or P, that will be introduced into the WSi$_x$ film 41 in later steps.

Figure 28:
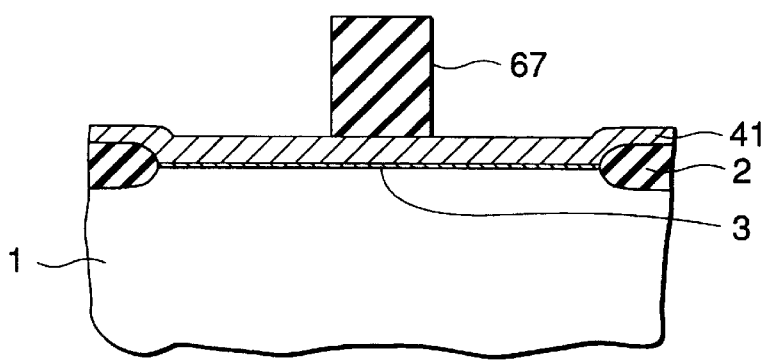

Then, as shown in FIG. 28, a photoresist film 67 having a gate electrode pattern is formed on the WSi$_x$ film 41.

Figure 29:
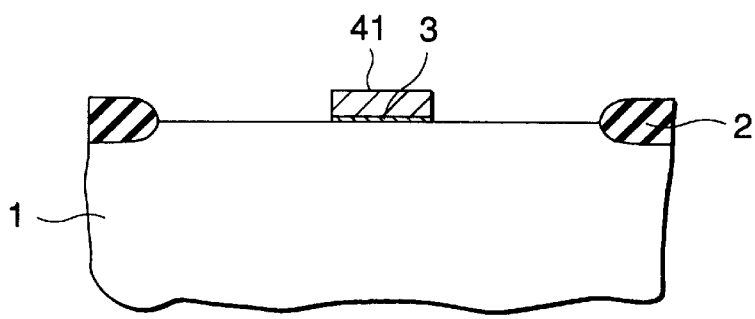

Thereafter, as shown in FIG. 29, the WSi$_x$ film 41 is etched by using the photoresist film 67 as a mask. The photoresist film 67 is then removed.

Figure 30:
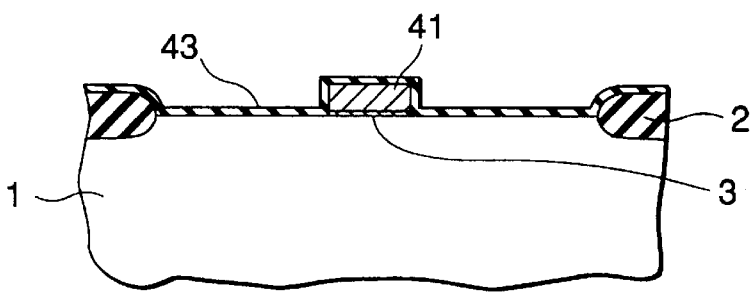

Then, as shown in FIG. 30, an Si$_3$N$_4$ film 43 of, for instance, about 10 nm in thickness is deposited on the WSi$_x$ gate electrode 41 and the silicon substrate 1 by LPCVD. The deposition conditions of the Si$_3$N$_4$ film 43 are the same as in the third embodiment. The Si$_3$N$_4$ film 43 is to inhibit outward diffusion of an impurity from the gate electrode 41.

Then, LDD layers (not shown) are formed in the silicon substrate 1 by introducing an impurity in LDD regions (not shown) in the silicon substrate 1. As for the impurity introduction, ion implantation operations are performed separately for the NMOS transistor and the PMOS transistor by using proper resist masks.

Figure 31:
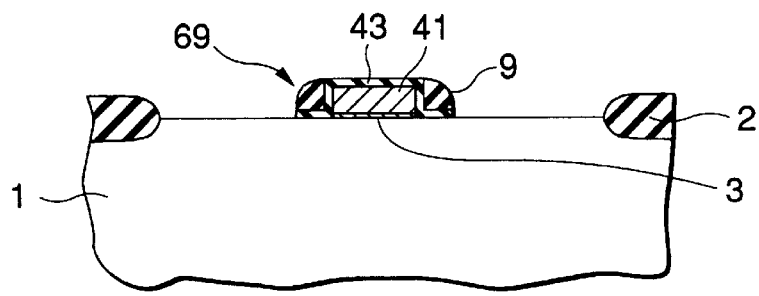

Thereafter, as shown in FIG. 31, an SiO$_2$ film 69 is deposited on the entire surface. Then, LDD spacers 69 of SiO$_2$ are formed on the side walls of the gate electrode 41 via an Si$_3$N$_4$ film 43 by etching back the SiO$_2$ film 69 by anisotropic etching. The deposition conditions and the etching conditions of the SiO$_2$ film 69 are the same as in the third embodiment.

Figure 32:
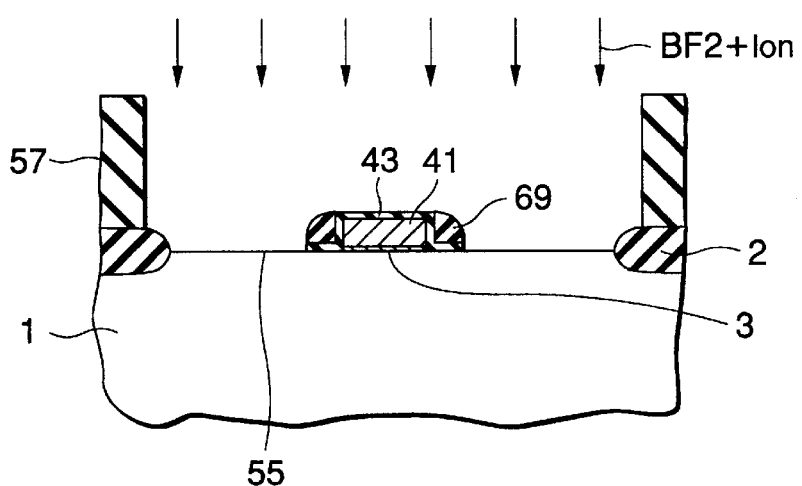

Then, as shown in FIG. 32, after a thin oxide film 55 for channel prevention is deposited on the silicon substrate 1, a photoresist film 57 is formed on the silicon film 57. The photoresist film 57 is so patterned as to have an opening in a source and drain regions forming region. Subsequently, an impurity is introduced (by ion implantation) into the gate electrode 1 and diffusion layers of source and drain regions by using the photoresist film 57 as a mask. In this step, ion implantation operations are performed separately for the NMOS transistor and the PMOS transistor by using proper resist masks.

Then, after the photoresist film 57 is removed, a heat treatment is performed to activate the gate electrode 41, the LDD layers, the diffusion layers of the source and drain regions, and other impurity-introduced layers. As for the heat treatment conditions, for example, RTA is performed at 1,000° C. for 10 seconds in an Ar atmosphere.

Figure 33:
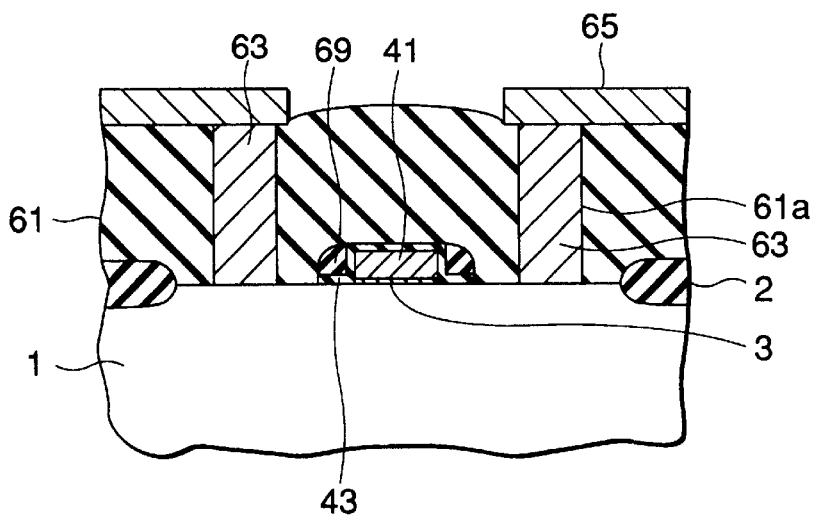

Thereafter, as shown in FIG. 33, an interlayer insulating film 61 is deposited on the Si$_3$N$_4$ film 43, the sidewall spacers 69, and the silicon substrate 1 by an ordinary process. Subsequently, contact holes 61$a$ are formed through the interlayer insulating film 61 and then filled in by metal 63. Interconnections 65 are formed on the metal members 63, complete the device.

In the fourth embodiment, the Si$_3$N$_4$ film 43 as a diffusion barrier layer is formed on the gate electrode 41 in the step of FIG. 30 after the WSi$_x$ film 41 is patterned into the gate electrode 41 in the step of FIG. 29, and an impurity is introduced into the gate electrode 41 by ion implantation or the like in the subsequent step of FIG. 32. Therefore, the work function of the gate electrode 41 of each single transistor is determined by the impurity concentration as introduced and there does not occur a variation in work function due to mutual lateral diffusion of impurities in the gate electrode forming film.

Where an impurity is introduced into a gate electrode after the gate electrode (refractory metal silicide film) has been formed by processing (etching) and then an impurity diffusion prevention film is formed, there arises a problem of outward diffusion or the like of the impurity in the gate electrode. This corresponds to a process shown in FIG. 25C. In contrast, in the fourth embodiment, since the impurity diffusion prevention film is formed before introducing an impurity into the refractory metal silicide film by ion implantation, there does not arise the problem of outward diffusion and spatial (i.e., lateral) redistribution of the impurity in the gate electrode. This corresponds to a process shown in FIG. 25D.

Therefore, the fourth embodiment provides basically the same advantages as the third embodiment.

Since in the step of FIG. 32 an impurity is introduced into the gate electrode 41 and the diffusion layers of the source and drain regions, the same ion species is introduced into the gate electrode 41 and the diffusion layers at the same dose. Accordingly, the degree of freedom of process designing is somewhat lowered. However, the fourth embodiment can greatly simplify the process as compared to the third embodiment and hence can reduce the manufacturing cost of a semiconductor device.

Although in the fourth embodiment the invention is applied to the manufacture of the MOS semiconductor device formed on the bulk silicon substrate 1 and having the $WSi_x$ gate electrode 41 whose work function is controlled, the invention can also be applied to manufacture of semiconductor devices having other kinds of gate electrodes. For example, the invention can be applied to manufacture of a semiconductor device having a gate electrode made of such a refractory metal silicide as $MoSi_x$.

Although in the fourth embodiment the invention is applied to the semiconductor device formed on the bulk silicon substrate 1, the invention can also be applied to a semiconductor device formed on an SOI substrate.

Although in the fourth embodiment the $Si_3N_4$ film 43 that is in contact with the gate electrode 41 and serves to inhibit outward diffusion of the impurity in the gate electrode 41 is deposited by LPCVD, it is possible to grow a refractory metal nitride film ($WN_x$ film) by directly nitriding the gate electrode 41 itself.

All of the numerical values of the parameters such as the thicknesses of the respective thin films used in the fourth embodiment are just examples, and the values of those parameters can be set properly in designing in accordance with an intended semiconductor device.

What is claimed is:

1. A manufacturing method of a semiconductor device, comprising the steps of:

forming a gate insulating film on a semiconductor device;

depositing a conductive film on the gate insulating film;

introducing an impurity into the conductive film;

depositing a first insulating film containing nitrogen on the conductive film;

processing the conductive film and the first insulating film into a pattern in which a remaining portion of the first insulating film exists on a remaining portion of the conductive film that is a gate electrode;

forming a second insulating film containing nitrogen on side walls of the remaining first insulating film and the gate electrode; and depositing an interlayer insulating film of $SiO_2$ on the first and second insulating films.

2. The manufacturing method according to claim 1, wherein the impurity is boron.

3. The manufacturing method according to claim 1, wherein the conductive film is made of $p^+$ polysilicon.

4. The manufacturing method according to claim 1, wherein each of the first and second insulating films is an $Si_3N_4$ film or an SiON film deposited by LPCVD or plasma CVD.

5. The manufacturing method according to claim 1, wherein each of the first and second insulating films has a two-layer structure of an $Si_3N_4$ film or an SiON film deposited by LPCVD or plasma CVD and an $SiO_2$ film.

6. A manufacturing method of a semiconduct or device, comprising the steps of:

forming a gate insulating film on a semiconductor substrate;

depositing a refractory metal silicide film on the gate insulating film;

forming a thin $Si_3N_4$ film for preventing impurity outward diffusion on the refractory metal silicide film; and introducing an impurity into the refractory metal silicide film through the thin film.

7. The manufacturing method according to claim 6, wherein the thin $Si_3N_4$ film is formed by LPCVD.

8. The manufacturing method according to claim 6, wherein the thin film is a metal nitride film formed by directly nitriding the refractory metal silicide film.

9. The manufacturing method according to claim 6, wherein the refractory metal silicide film is a $WSi_x$ film or a $MoSi_x$ film.

10. A manufacturing method of a semiconductor device, comprising the steps of:

forming a gate insulating film on a semiconductor substrate;

depositing a refractory metal silicide film on the gate insulating film;

patterning the refractory metal silicide film into a gate electrode;

forming a thin $Si_3N_4$ film for preventing impurity outward diffusion on all or part of surfaces of the gate electrode; and introducing an impurity into the gate electrode through the thin film.

11. The manufacturing method according to claim 10, wherein the thin $Si_3N_4$ film is formed by LPCVD.

12. The manufacturing method according to claim 10, wherein the thin film is a metal nitride film formed by directly nitriding the gate electrode.

13. The manufacturing method according to claim 10, wherein the refractory metal silicide film is a $WSi_x$ film or a $MoSi_x$ film.

* * * * *

UNITED STATES PATENT AND TRADEMARK OFFICE
CERTIFICATE OF CORRECTION

PATENT NO.    : 6,218,274 B1
DATED         : April 17, 2001
INVENTOR(S)   : Hiroshi Komatsu et al.

It is certified that error appears in the above-identified patent and that said Letters Patent is hereby corrected as shown below:

<u>Column 16,</u>
Line 18, replace "semiconduct or" with -- semiconductor --.

Signed and Sealed this

Eleventh Day of March, 2003

JAMES E. ROGAN
*Director of the United States Patent and Trademark Office*